United States Patent
Ho et al.

(10) Patent No.: US 6,882,229 B1
(45) Date of Patent: Apr. 19, 2005

(54) DIVIDE-BY-X.5 CIRCUIT WITH FREQUENCY DOUBLER AND DIFFERENTIAL OSCILLATOR

(75) Inventors: Jeff Ho, Hong Kong (CN); Choy Kwok Wing, Hong Kong (CN)

(73) Assignee: Pericom Semiconductor Corp., San Jose, CA (US)

( * ) Notice: Subject to any disclaimer, the term of this patent is extended or adjusted under 35 U.S.C. 154(b) by 110 days.

(21) Appl. No.: 10/604,461

(22) Filed: Jul. 23, 2003

(51) Int. Cl.[7] ............................................... H03L 7/00
(52) U.S. Cl. ..................... 331/1 A; 331/45; 327/156; 327/158
(58) Field of Search .................... 331/1 A, 45; 327/156, 327/158, 160, 161

(56) References Cited

U.S. PATENT DOCUMENTS

| | | | |
|---|---|---|---|
| 3,930,169 A | 12/1975 | Kuhn | 377/107 |
| 4,041,403 A * | 8/1977 | Chiapparoli, Jr. | 377/48 |
| 4,348,640 A | 9/1982 | Clendening | 377/48 |
| 4,354,188 A | 10/1982 | Schneider | 377/48 |
| 4,587,664 A | 5/1986 | Iida | 377/48 |
| 4,590,439 A | 5/1986 | Goggin | 331/1 A |
| 4,606,059 A | 8/1986 | Oida | 377/47 |
| 4,866,741 A | 9/1989 | Minuhin | 377/48 |
| 4,935,944 A | 6/1990 | Everett | 377/48 |
| 4,942,595 A | 7/1990 | Baca | 377/48 |
| 5,339,345 A | 8/1994 | Mote | 377/48 |
| 5,442,670 A | 8/1995 | Shu | 377/48 |
| 5,457,722 A | 10/1995 | Chahabadi | 377/47 |
| 6,356,123 B1 * | 3/2002 | Lee et al. | 327/115 |
| 6,389,095 B1 | 5/2002 | Sun | 377/48 |
| 6,445,760 B1 | 9/2002 | Weintraub et al. | 377/48 |

* cited by examiner

*Primary Examiner*—Michael B Shingleton
(74) *Attorney, Agent, or Firm*—Stuart T. Auvinen

(57) ABSTRACT

A divide by X.5 circuit can be implemented as a divided by 1.5 circuit. A phase-locked loop (PLL) has a quadrature voltage-controlled oscillator (VCO) that generates four phases offset at 0, 90, 180, and 270 degrees. Differential signals from the VCO are converted to single-ended VCO clocks that drive four divide-by-3 circuits, each clocked by one of the four phases of the VCO clocks. Resets to the divide-by-3 circuits are staggered to activate each divide-by-3 circuit synchronously with its phase clock. Outputs from the divide-by-3 circuits are applied to a frequency doubler that generates the final clock that is 1.5 times slower than the VCO clocks. The final clock has a near 50%–50% duty cycle.

20 Claims, 7 Drawing Sheets

US 6,882,229 B1

DIVIDE-BY-X.5 CIRCUIT WITH FREQUENCY DOUBLER AND DIFFERENTIAL OSCILLATOR

BACKGROUND OF INVENTION

This invention relates to digital dividers, and more particularly to X.5 divide circuits.

Digital circuits often employ dividers. For example, a clock operating at a higher frequency may be divided by a dividing circuit to generate a lower-frequency clock. Clocked flip-flops can be used when the divisor is a power of two, such as with divide-by-$2^N$ circuits, wherein N is a positive integer.

Sometimes a divisor is required that is not a power of two, or not even an integer. For example, a 333 MHz clock may be needed, but only a 500 MHz clock is available. The divisor needed is 500/333, or 1.5 (one and a half). Or a 200 MHz clock is needed, requiring a divider circuit with a divisor of 500/200=2.5, another non-integer divisor.

A variety of such divide by X.5 circuits have been developed, where X is a positive integer (whole number). The duty cycle produced by these circuits may not always be ideal. Sometimes the output clock's duty cycle is altered, such as when a 60%–40% or worse duty cycle is generated.

What is desired is a divide by X.5 circuit, wherein X is a whole number. A divide by X.5 circuit is desirable that has a near 50%—50% duty cycle.

DETAILED DESCRIPTION

The present invention relates to an improvement in divide by X.5 circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
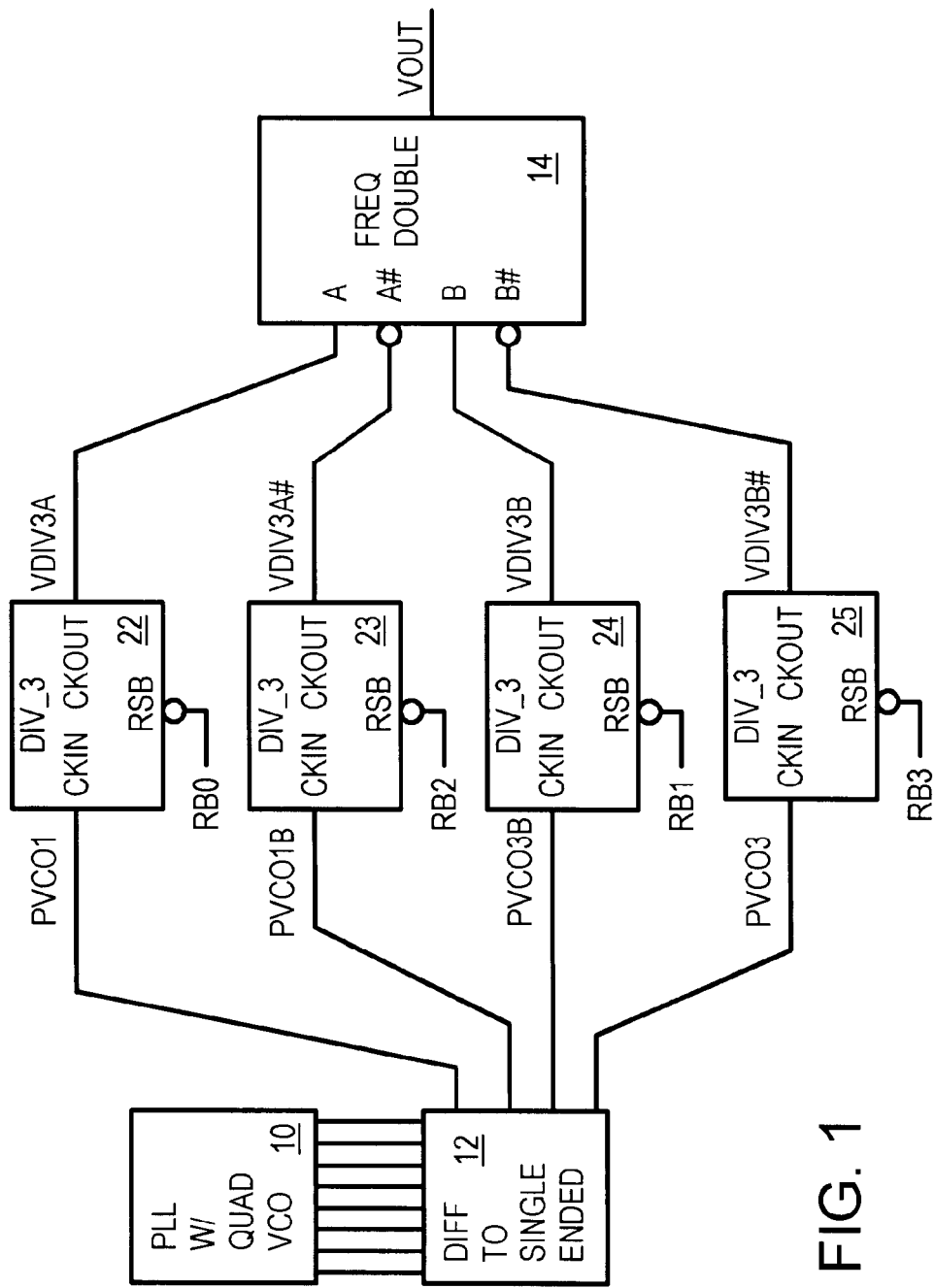
FIG. 1 is an overall block diagram of a divide by 1.5 circuit.

FIG. 1 is an overall block diagram of a divide by 1.5 circuit. Phase-locked loop (PLL) 10 includes a quadrature voltage-controlled oscillator (VCO) that outputs four phases of clocks having the same frequency, but being offset in phase from one another by 90-degree increments. The multi-phase clocks from PLL 10 have phases of 0, 90, 180, and 270 degrees.

Differential pairs of each of the four phases from PLL 10 are converted from differential to single-ended clocks by differential-to-single-ended converters 12. The four phase clocks output by differential-to-single-ended converters 12 are PVCO1, PVCO1B, PVCO3B, and PVCO3, having phases of 0, 180, 270, and 90 degrees, respectively.

Divide-by-3 circuits 22, 23, 24, 25 are clocked by are PVCO1, PVCO1B, PVCO3B, and PVCO3, respectively, and produce divided-by-3 outputs VDIV3A, VDIV3A#, VDIV3B, VDIV3B#, respectively. The divided-by-3 outputs are one-third the frequency of the input clocks from PLL 10.

Reset signals RB0, RB2, RB1, RB3 are applied to divide-by-3 circuits 22, 23, 24, 25, respectively. These active-low reset signals are sequenced to periodically reset divide-by-3 circuits 22, 23, 24, 25 after each counts up to three.

Divided-by-3 outputs VDIV3A, VDIV3A#, VDIV3B, VDIV3B# are applied to the A, A#, B, B# inputs (respectively) of frequency doubler 14. Frequency doubler 14 doubles the frequency of divided-by-3 outputs VDIV3A, VDIV3A#, VDIV3B, VDIV3B# to generate the final output VOUT, which has a frequency that is 1.5 or 3/2 of the frequency output by PLL 10.

Figure 2:
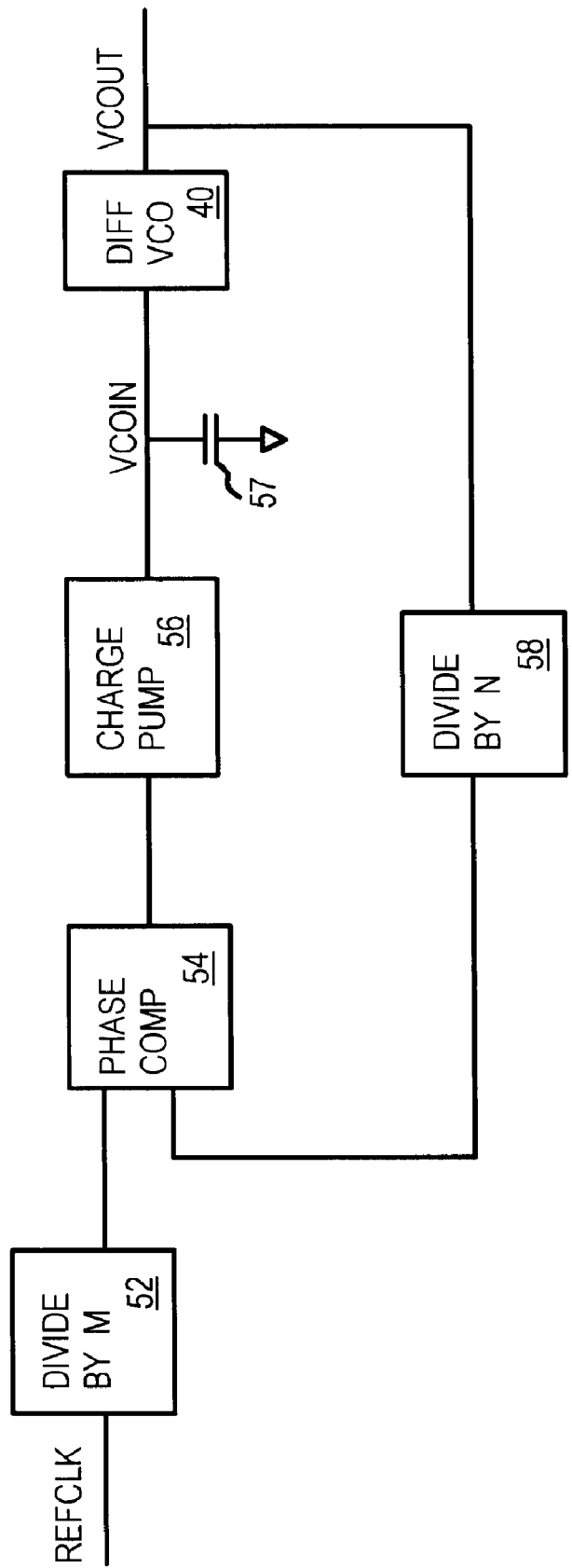
FIG. 2 show the initial PLL with a quadrature VCO in more detail.

FIG. 2 show the initial PLL with a quadrature VCO in more detail. PLL 10 receives a reference clock REFCLK that is divided by M by input divider 52. The high-frequency output signal VCOUT of voltage-controlled oscillator VCO 40 is divided down by feedback divider 58 to a lower feedback frequency. The output signal of divider 58 is applied to one of the inputs of phase comparator 54 to perform phase and frequency comparison with the divided-down reference clock applied to the other input.

Phase comparator 54 controls charge pump 56 to sink or source currents to loop filter 57, which increases or decreases the output voltage VCOIN of loop filter 57. Loop filter 57 is used to filter out high-frequency noise from charge pump 56 and to stabilize the closed-loop system of PLL 10.

The output voltage VCOIN of loop filter 57 is applied as the control voltage to VCO 40 to control its output frequency. This negative feedback system can ensure that the output frequency of the oscillator equals the input clock frequency multiplied by dividing ratio N/M in the locked condition.

Figure 3:
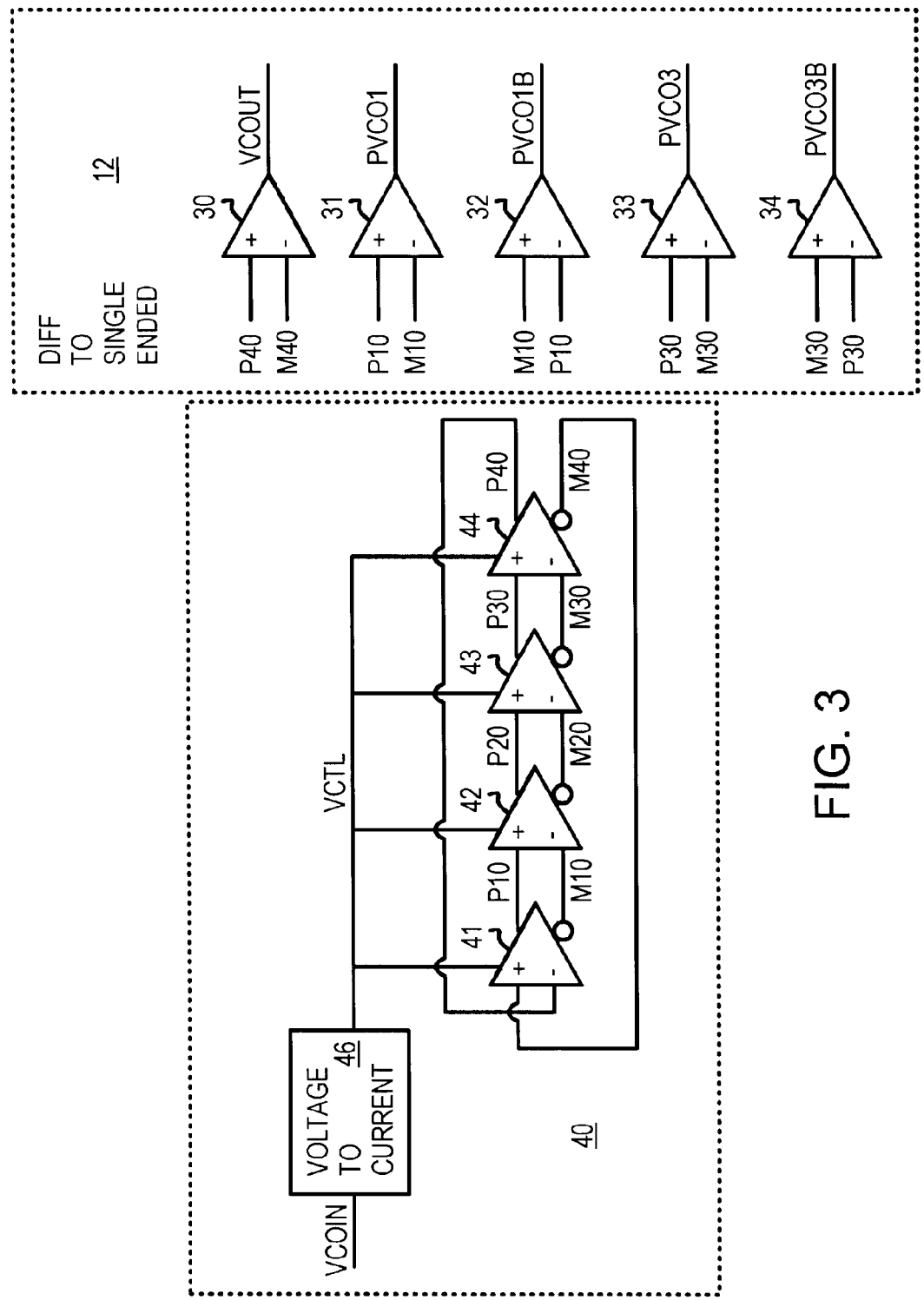
FIG. 3 shows the quadrature VCO in more detail.

FIG. 3 shows the quadrature VCO in more detail. The loop filter's voltage VCOIN is applied to voltage-to-current converter 46. A variable current is generated on line VCTL by voltage-to-current generator 46.

The bias current on line VCTL is applied to differential stages 41, 42, 43, 44, and controls their propagation delays, such as by varying the current-drive of the differential stages. Thus the propagation delays of differential stages 41, 42, 43, 44 vary with bias current applied to line VCTL and loop-filter voltage VCOIN.

Differential stages 41, 42, 43, 44 are connected together in a twisted-ring fashion, since an inversion occurs on the feedback from last differential stage 44 back to first differential stage 41, since the non-inverting ((+)) output P40 of stage 44 is applied to the inverting input (−) of first differential stage 41. Likewise, the inverting (−) output M40 of stage 44 is applied to the non-inverting input ((+)) of first differential stage 41. Other stages 41, 42, 43 connect their non-inverting outputs P10, P20, P30 to non-inverting inputs of next stages 42, 43, 44, and inverting outputs M10, M20, M30 to inverting inputs.

Some of the signals from the current-controlled-delay loop of differential stages 41, 42, 43, 44 in VCO 40 are applied to differential-to-single-ended converters 12. The PLL output VCOUT that is fed back to the feedback inverter in PLL 10 is generated by differential buffer 30, which receives differential signals P40 and M40 from last differential stage 44.

The first quadrature signal PVCO1 is generated by differential buffer 31, which receives differential signals P10 and M10 from first differential stage 41. This signal PVCO1 represents the 0 degree relative offset. Since the twisted-ring loop of differential stages 41, 42, 43, 44 has a total of 8 delays in the two passes through the loop, a 90-degree offset occurs after one-quarter of the overall loop delay, or after 2 differential stages. Thus the 90-degree-offset signal, PVCO3 is generated by differential buffer 33 from signals P30, M30 of third differential stage 43. Third differential stage 43 is two stage delays after first differential stage 41.

The 180-degree signal PVCO1B is generated from first differential stage 41, except that the inputs are reversed. Differential buffer 32 applies the inverted output M10 from first differential stage 41 to its non-inverting ((+)) input, while the non-inverted output P10 from first differential stage 41 to its inverting (–) input. Similarly, the 270-degfree signal PVCO3B is generated by differential buffer 34 by reversing the inputs from third differential stage 43. Inverted signal M30 from third differential stage 43 is applied to the non-inverting ((+)) input of differential buffer 34, while the non-inverted output P30 from third differential stage 41 is applied to the inverting (–) input of differential buffer 34.

Figure 4:
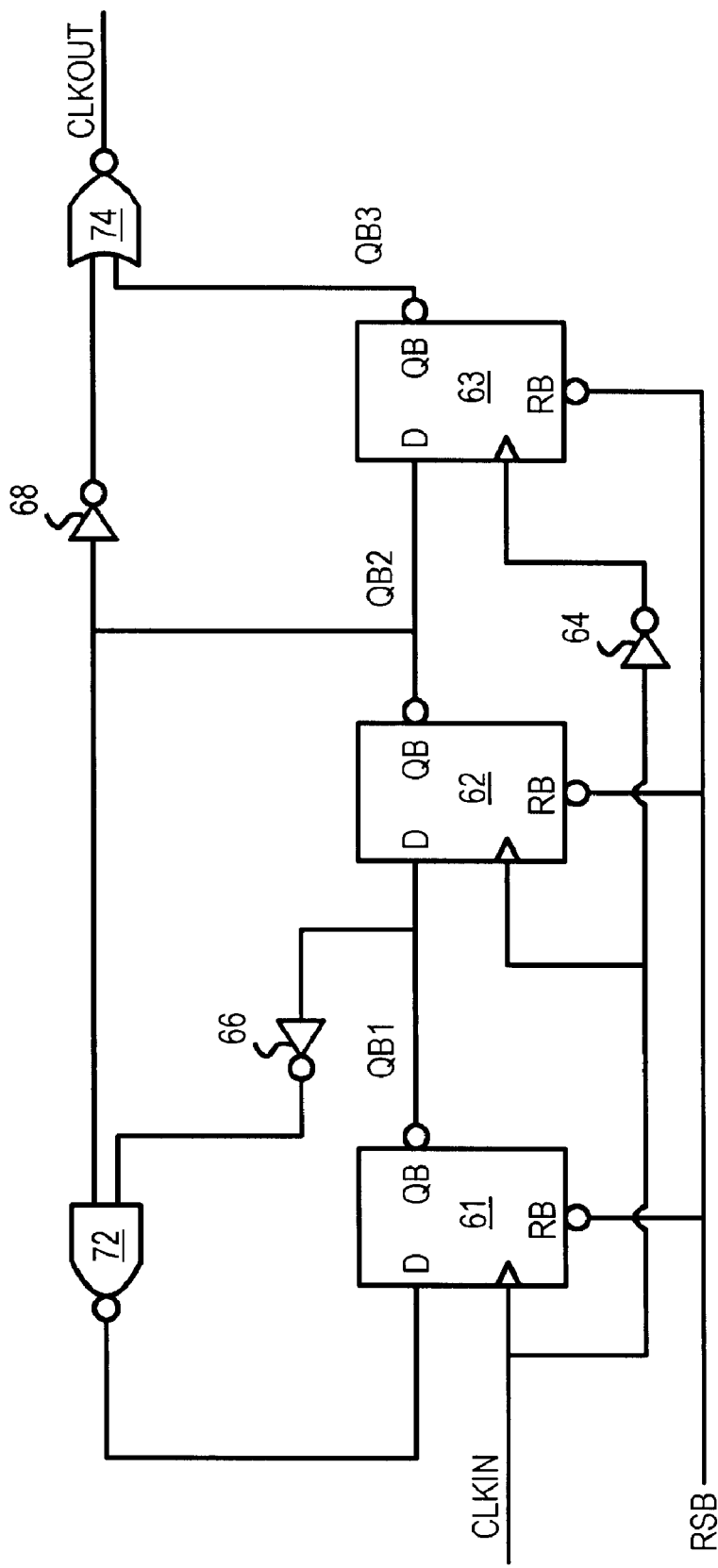
FIG. 4 shows a divide-by-3 circuit.

FIG. 4 shows a divide-by-3 circuit. Divide-by-3 circuit 22 receives a single-ended VCO output signal on its clock CLKIN input. The sequenced active-low reset signal RSB is also received and applied to the reset inputs of flip-flops 61, 62, 63. When RSB is low, flip-flops 61, 62, 63 are cleared and their QB outputs are driven high. NOR gate 74 then drives the divided-by-3 output, CLKOUT low.

After reset RSB goes high, the states of QB1, QB2, and QB3 are initially 1,1,1. The first rising edge of CLKIN clocks first and second flip-flops 61, 62. The D input to first flip-flop 61 is high, the result of QB1+QB2', the logic of inverter 66 and NAND gate 72. First flip-flop 61 toggles its QB1 output low, and second flip-flop 62 toggles low, since QB1 is high, producing QB2 low, after the first rising edge of CLKIN.

The first falling edge of the VCO clock input (CLKIN) clocks third flip-flop 63, which has the previous flip-flop's QB2 (low) as its D input. QB3 of third flip-flop 63 thus goes high after the first falling edge. The high QB3 drives an input to NOR gate 74, which drives CLKOUT low.

The states of QB1 and QB2 are now 0,0. The second rising edge of CLKIN clocks first and second flip-flops 61, 62. The D input to first flip-flop 61 is high, the result of QB1+QB2'. First flip-flop 61 keeps its QB1 output low, but second flip-flop 62 again toggles, with QB2 going high, after the second rising edge of CLKIN.

The states of QB1 and QB2 are now 0,1. The third rising edge of CLKIN clocks first and second flip-flops 61, 62. The D input to first flip-flop 61 is low, the result of QB1+QB2'. First flip-flop 61 toggles its QB1 output high, but second flip-flop 62 remains in the same state, with QB2 remaining high, after the third rising edge of CLKIN.

The states of QB1 and QB2 are now 1,1. This is the same as the initial state after reset. The 3-period cycle now repeats itself. The fourth rising edge of CLKIN clocks first and second flip-flops 61, 62. The D input to first flip-flop 61 is high, the result of QB1+QB2', the logic of inverter 66 and NAND gate 72. First flip-flop 61 toggles its QB1 output low, and second flip-flop 62 toggles, since QB1 is high, producing QB2 low, after the fourth rising edge of CLKIN, to return to the 0,0 state.

Third flip-flop 63 delays QB2 from second flip-flop 62 by one-half clock period, since third flip-flop 63 is clocked by inverter 64, which inverts CLKIN. NOR gate 74 OR's QB2 after inverter 68 and QB3, driving CLKOUT high when QB2 is high and QB3 is low. This occurs for one-and-a-half periods of CLKIN, starting with the second falling edge of CLKIN, and ending with the fourth (first) rising edge of CLKIN.

Figure 5:
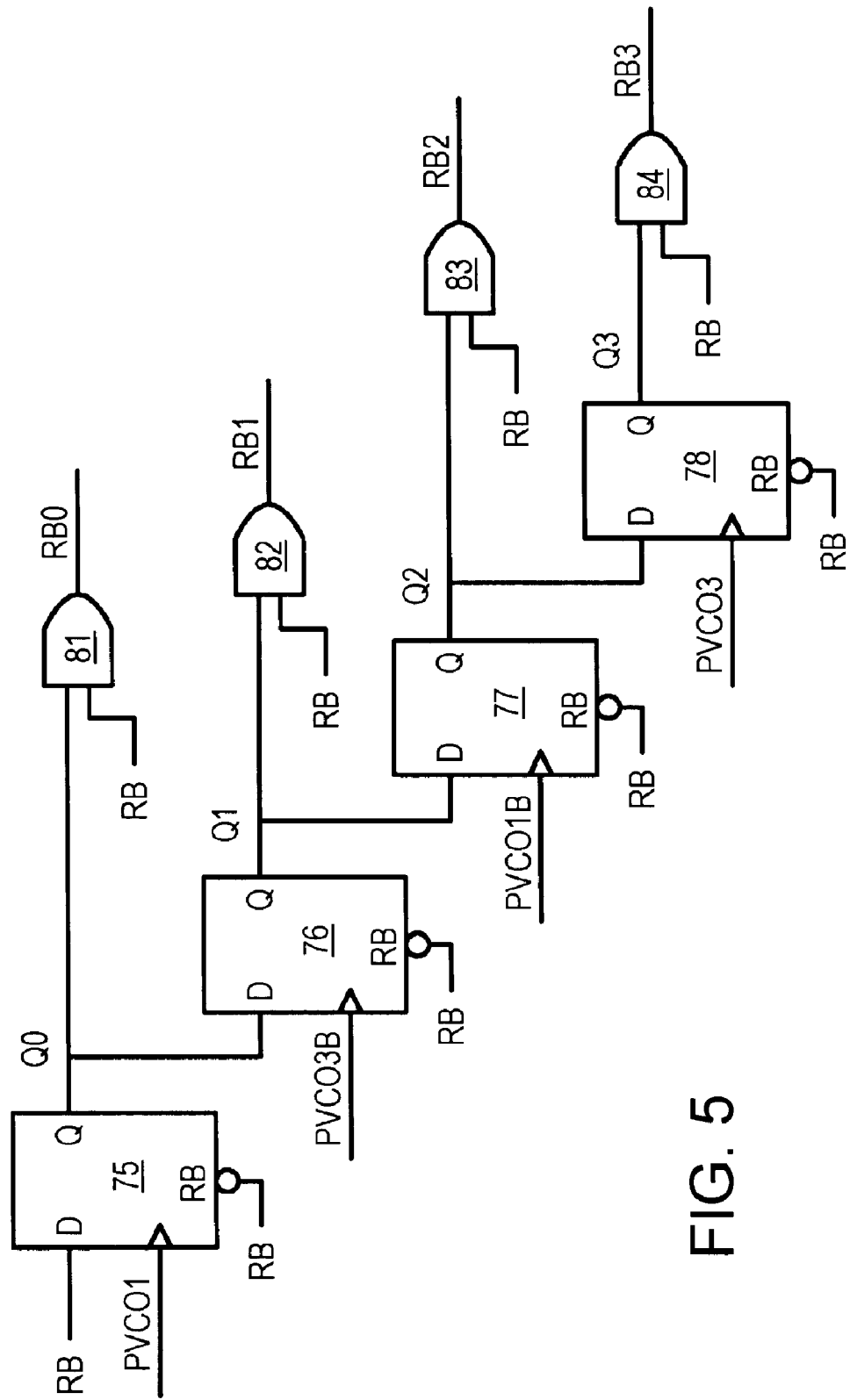
FIG. 5 is a diagram of reset-sequencing logic.

FIG. 5 is a diagram of reset-sequencing logic. The active-low reset signals to divide-by-3 circuits 22, 23, 24, 25 differ. When the primary reset RSB is de-asserted (goes high), then reset signals RB0, RB1, RB2, and RB3 are each driven high in sequence. Each successive reset is driven high one-half output-clock period after the prior reset is driven high. This causes the divide-by-3 circuits to begin counting at different times, on each edge of the output clock.

The primary reset RSB is applied to the D input of first flip-flop 75. When its clock, PVCO1, goes high, flip-flop 75 drives its output (Q0) high. AND gate 81 then drives first reset signal RB0 high, since the RB inputs to AND gates 81, 82, 83, 84 have already gone high. First flip-flop 75 continues to drive Q0 and RB0 high on later rising clock edges of PVCO1 since RB remains high. Thus Q0 and RB0 go high and remain high.

The next rising edge of PVCO3B clocks second flip-flop 76, which receives Q1 from first flip-flop 75 at its D input and drives Q1 high. The high Q1 to AND gate 82 drives RB1 high. The D input to third flip-flop 77 is Q1, so on the next rising edge of PVCO1B, third flip-flop 77 drives Q2 high, and AND gate 83 drives RB2 high.

Finally the D input (Q2) to fourth flip-flop 78 is high, so on the next rising edge of PVCO3, fourth flip-flop 78 clocks Q3 high, and AND gate 84 drives RB3 high, allowing the fourth divide-by-3 circuits 25 to begin counting.

Figure 6:
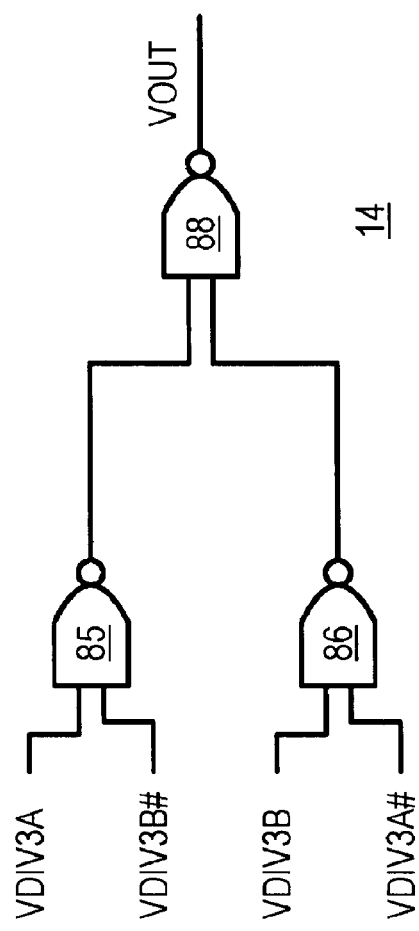
FIG. 6 is a diagram of a frequency doubler.

FIG. 6 is a diagram of a frequency doubler. Frequency doubler 14 has NAND gate 85 that receives VDIV3A and VDIV3B#, and NAND gate 86 that receives VDIV3B and VDIV3A#. NAND gate 88 sums the outputs of NAND gates 85, 86 to generate the final clock output VOUT.

VOUT is high when VDIV3B and VDIV3A# are both high, or when VDIV3A and VDIV3B# are both high.

Figure 7:
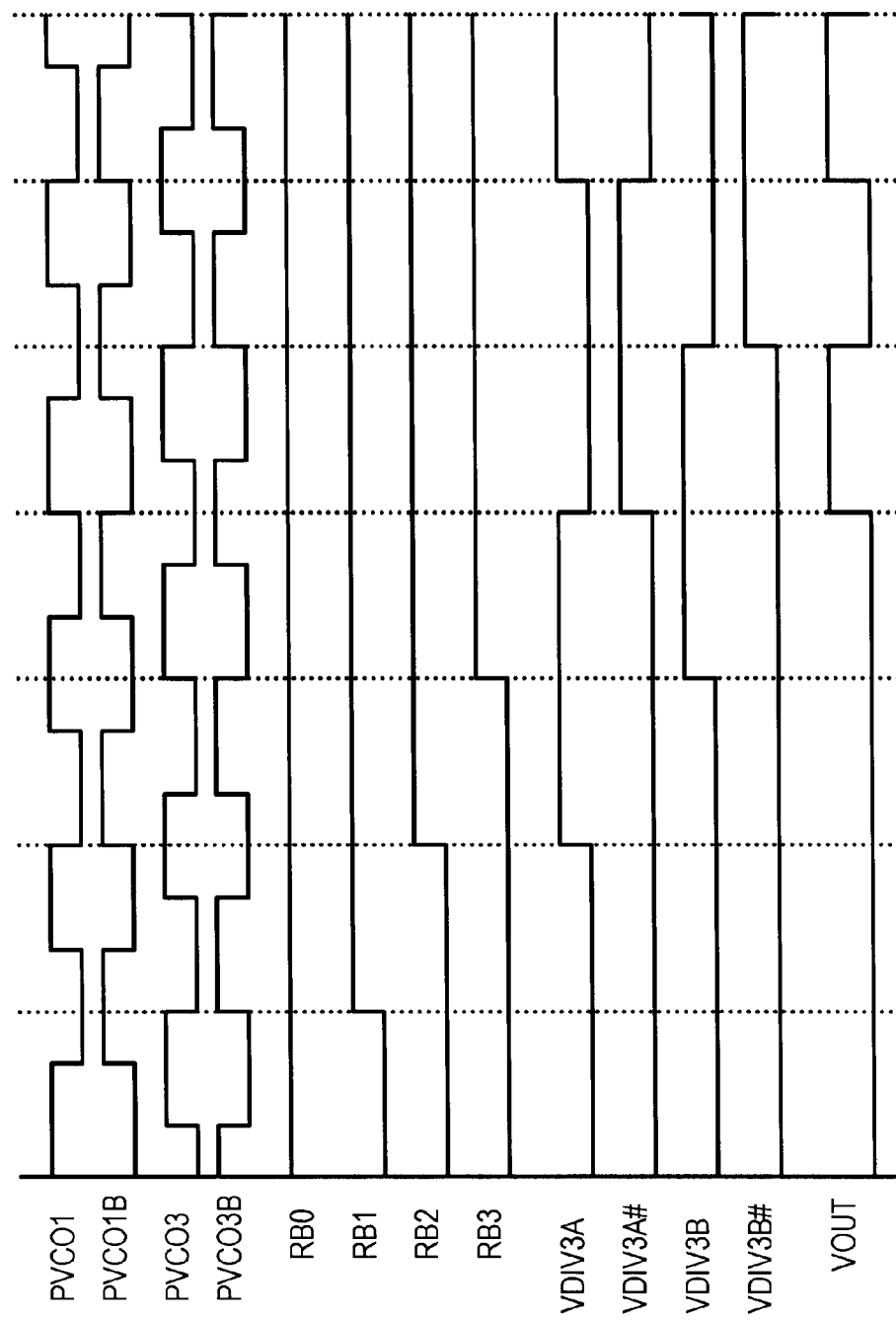
FIG. 7 is a waveform showing operation of the divide by 1.5 circuit.

FIG. 7 is a waveform showing operation of the divide by 1.5 circuit. On the Y-axis, PVCO1 and reset RB0 go high, allowing divide-by-3 circuit 22 to begin counting. On the next rising edge of PVCO3B, reset RB1 goes high, allowing divide-by-3 circuit 24 to begin counting. Then on the next rising edge of PVCO1B, reset RB2 goes high, allowing divide-by-3 circuit 23 to begin counting. Finally, on the next rising edge of PVCO3, reset RB3 goes high, allowing divide-by-3 circuit 25 to begin counting. Each divide-by-3 circuits 22, 23, 24, 25 has its reset go high on the rising edge of its clock input. Since each reset is generated by its corresponding clock, there is no logic hazard.

The VCO output signals PVCO1, PVCO3, PVCO1B, PVCO3B are free-running with the PLL's oscillator and operate at the input frequency which is divided by 1.5 to get the output frequency of the frequency doubler's output, VOUT. The vertical dashed lines are drawn to correspond to half-clock periods of the final output clock VOUT, but shifted for pipelining delays. Oscillator signals PVCO1, PVCO3, PVCO1B, PVCO3B operate with a period that is ⅔'rds the output period. For 50% duty cycles, one-and-a-half periods of oscillator input PVCO1 equals one output period of VOUT.

Oscillator signals PVCO1, PVCO3, PVCO1B, PVCO3B are 0, 90, 180, and 270 degrees out of phase with PVCO1, respectively. PVCO1 has a rising edge at the Y-axis, PVCO3 has the next rising edge, then PVCO1B which is an inverse of PVCO1 (180 degrees), and finally PVCO3B rises at 270 degrees.

The divide-by-3 circuits generate the VDIV3 signals that have a period that is three times the period of the oscillator signal input to the divide-by-3 circuit. For example, PVCO1 is input to first divide-by-3 circuit 22, which generates VDIV3A. PVCO1 has a rising edge at the Y-axis, another in the second period of VOUT, a third rising edge in the third period of VOUT, and the fourth rising edge (ending the third full period of PVCO1) at the end of the fourth period of VOUT, when VDIV3A falls, ending its first period. VDIV3A rises mid-way in its period for a 50—50 duty cycle. VOUT doesn't start pulsing until several periods after reset ends.

The next divide-by-3 circuit 24 is activated by RB1 going high at the end of the first period of VOUT. This divide-by-3 circuit 24 is clocked by PVCO3B, which is the 270-degee oscillator signal. VDIV3B is generated by divide-by-3 circuit 24 and is driven high on the second falling edge of PVCO3B after reset RB1 ends.

Each of the four divide-by-3 circuits 22, 23, 24, 25 drives its output high on the second rising VCO-clock edge after its corresponding reset goes high. At the Y-axis, RB0 goes high, activating divide-by-3 circuit 22 to begin counting with PVCO1, and driving VDIV3A high at the second falling edge of PVCO1. One-and-a-half periods of PVCO1 later, VDIV3A goes low. Then VDIV3A goes high after another one-and-a-half periods of PVCO1. This continues, producing a 50%—50% duty cycle of VDIV3A.

RB1 then goes high, activating divide-by-3 circuit 24 to begin counting with PVCO3B, and driving VDIV3B high at the second falling edge of PVCO3B. One-and-a-half periods of PVCO3B later, VDIV3B goes low. Then VDIV3B goes high after another one-and-a-half periods of PVCO3B. This continues, producing a 50%—50% duty cycle of VDIV3B.

When RB2 goes high, divide-by-3 circuit 23 begins counting with PVCO1B, and driving VDIV3A# high at the second falling edge of PVCO1B. One-and-a-half periods of PVCO1B later, VDIV3A# goes low. Then VDIV3A# goes high after another one-and-a-half periods of PVCO1B. This continues, producing a 50%—50% duty cycle of VDIV3A#.

Finally, when RB3 goes high, divide-by-3 circuit 25 begins counting with PVCO3, and driving VDIV3B# high at the second falling edge of PVCO3. One-and-a-half periods of PVCO3 later, VDIV3B# goes low. Then VDIV3B# goes high after another one-and-a-half periods of PVCO3. This continues, producing a 50%—50% duty cycle of VDIV3B#.

Alternate Embodiments

Several other embodiments are contemplated by the inventors. Other divisors can be achieved by substituting a divide-by-Y circuit for the divide-by-3 circuits of FIG. 1, where Y is another odd integer (5, 7, 9, . . . ). For example, a divide by 2.5 circuit uses divide-by-5 circuits rather than divide-by-3 circuits, while a divide by 3.5 circuit uses divide-by-7 circuits rather than divide-by-3 circuits. Phase offsets may not be exactly 90, 180, 270 degrees but may vary somewhat.

Differential buffers and stages can be implemented in a variety of ways, such as by using current-mirrored differential amplifiers, sense amplifiers, etc. AND gates can be implemented as a NAND gate driving an inverter, and other logic adjustments can be made.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A divide-by-X.5 circuit, wherein X is a whole number, comprising:

a phase-locked loop having a voltage-controlled oscillator (VCO) that generates four phase clocks having a same input frequency but having differing phase offsets;

a first divide-by-X-plus-two circuit, receiving a first phase clock of the four phase clocks, for generating a first divided-by-X-plus-two signal that has a frequency being the input frequency divided by (X+2), the first divided-by-X-plus-two signal being synchronous to the first phase clock;

a second divide-by-X-plus-two circuit, wherein X-plus-two is twice X, receiving a second phase clock of the four phase clocks, for generating a second divided-by-X-plus-two signal that has a frequency being the input frequency divided by (X+2), the second divided-by-X-plus-two signal being synchronous to the second phase clock;

a third divide-by-X-plus-two circuit, wherein X-plus-two is twice X, receiving a third phase clock of the four phase clocks, for generating a third divided-by-X-plus-two signal that has a frequency being the input frequency divided by (X+2), the third divided-by-X-plus-two signal being synchronous to the third phase clock;

a fourth divide-by-X-plus-two circuit, wherein X-plus-two is twice X, receiving a fourth phase clock of the four phase clocks, for generating a fourth divided-by-X-plus-two signal that has a frequency being the input frequency divided by (X+2), the fourth divided-by-X-plus-two signal being synchronous to the fourth phase clock; and a frequency doubler, receiving the first, second, third, and fourth divided-by-X-plus-two signals, for generating an output clock having an output frequency that is the input frequency divided by X.5, whereby the output clock is generated from the four phase clocks from the voltage-controlled oscillator.

2. The divide-by-X.5 circuit of claim 1 wherein the frequency doubler comprises:

a first gate, receiving the first divided-by-X-plus-two signal and the fourth divided-by-X-plus-two signal;

a second gate, receiving the second divided-by-X-plus-two signal and the third divided-by-X-plus-two signal;

a summing gate, coupled to the first and second gates, for generating the output clock.

3. The divide-by-X.5 circuit of claim 2 wherein the first gate, the second gate, and the summing gate are NAND gates.

4. The divide-by-X.5 circuit of claim 3 further comprising:

a reset sequencer, receiving a system reset signal, for generating a sequence of staggered reset signals applied to the first, second, third, and fourth divide-by-X-plus-two circuit to successively activate the first, second, third, and fourth divide-by-X-plus-two circuits upon completion of reset.

5. The divide-by-X.5 circuit of claim 4 wherein the reset sequencer comprises:

a first flip-flop receiving the system reset signal and generating a first reset to the first divide-by-X-plus-two circuit;

a second flip-flop receiving an output of the first flip-flop and generating a second reset to the second divide-by-X-plus-two circuit;

a third flip-flop receiving an output of the second flip-flop and generating a third reset to the third divide-by-X-plus-two circuit; and a fourth flip-flop receiving an output of the third flip-flop and generating a fourth reset to the fourth divide-by-X-plus-two circuit.

6. The divide-by-X.5 circuit of claim 5 wherein the first flip-flop is clocked by the first phase clock;

wherein the second flip-flop is clocked by the second phase clock;

wherein the third flip-flop is clocked by the third phase clock;

wherein the fourth flip-flop is clocked by the fourth phase clock, whereby flip-flops are clocked by different phases.

7. The divide-by-X.5 circuit of claim 2 wherein the voltage-controlled oscillator comprises:

a first differential stage receiving a first true input and a first complement input and generating a first true output and a first complement output;

a second differential stage receiving the first true output and the first complement output and generating a second true output and a second complement output;

a third differential stage receiving the second true output and the second complement output and generating a third true output and a third complement output;

a fourth differential stage receiving the third true output and the third complement output and generating a fourth true output and a fourth complement output;

wherein the fourth true output is applied to the first complement input of the first differential stage;

wherein the fourth complement output is applied to the first true input of the first differential stage.

8. The divide-by-X.5 circuit of claim 7 further comprising:

differential to single-ended converters, each receiving a pair of true and complement outputs from the first, second, third, or fourth differential stages, for generating the four phase clocks.

9. The divide-by-X.5 circuit of claim 8 wherein the voltage-controlled oscillator generates quadrature phases for the four phase clocks, the four phase clocks having phases offsets that are multiplies of about 90 degrees.

10. The divide-by-X.5 circuit of claim 9 wherein the second phase clock has a phase of about 270 degrees relative to the first phase clock;

wherein the third phase clock has a phase of about 180 degrees relative to the first phase clock;

wherein the fourth phase clock has a phase of about 90 degrees relative to the first phase clock.

11. The divide-by-X.5 circuit of claim 10 wherein X is 1 and X-plus-two is 3, wherein the divide-by-X.5 circuit divides the input frequency by 1.5 to generate the output frequency.

12. A divider comprising:

quadrature clock means for generating a first clock, a second clock, a third clock, and a fourth clock all having an input frequency but having differing phases;

first double divider means, receiving the first clock, for generating a first divided clock having an intermediate frequency that is the input frequency divided by X+2;

wherein X is an odd integer greater than zero;

second double divider means, receiving the second clock, for generating a second divided clock having the intermediate frequency that is the input frequency divided by X+2;

third double divider means, receiving the third clock, for generating a third divided clock having the intermediate frequency that is the input frequency divided by X+2;

fourth double divider means, receiving the fourth clock, for generating a fourth divided clock having the intermediate frequency that is the input frequency divided by X+2;

reset sequence means, receiving the first, second, third, and fourth clocks, for generating a first reset signal to the first double divider means, a second reset signal to the second double divider means, a third reset signal to the third double divider means, and a fourth reset signal to the fourth double divider means, the reset sequence means de-activating the first, second, third, and fourth reset signals at separate times in a sequence; and frequency doubling means, receiving the first, second, third, and fourth divided clocks, for generating an output clock having an output frequency that is double am intermediate frequency of the first divided clock, whereby the input frequency is X.5 times the output frequency.

13. The divider of claim 12 wherein the second clock has a phase of about 270 degrees relative to the first clock;

wherein the third clock has a phase of about 180 degrees relative to the first clock;

wherein the fourth clock has a phase of about 90 degrees relative to the first clock.

14. The divider of claim 13 wherein X is one.

15. The divider of claim 13 further comprising:

phase compare means, receiving a reference clock and a feedback clock, for comparing phases of the feedback clock to the reference clock;

loop filter means for generating a control voltage;

charge pump means, responsive to the phase compare means, for charging and discharging the loop filter means;

wherein the quadrature clock means is part of a voltage-controlled oscillator that receives the control voltage from the loop filter means, the voltage-controlled oscillator also generating the feedback clock or a pre-feedback clock.

16. The divider of claim 15 further comprising:

feedback divider means, receiving the pre-feedback clock from the voltage-controlled oscillator, for generating the feedback clock by dividing the pre-feedback clock.

17. The divider of claim 16 further comprising:

differential convert means, receiving differential pairs of oscillator clocks from the voltage-controlled oscillator, for generating the first, second, third, and fourth clocks from the differential pairs of oscillator clocks.

18. A 1.5 divider comprising:

a phase-locked loop with a voltage-controlled oscillator that generates a first clock having a first phase, a second clock having a second phase that is offset from the first phase, a third clock having a third phase that is offset from the first phase and from the second phase, and a fourth clock having a fourth phase that is offset from the first phase, the second phase, and the third phase;

a reset generator, receiving a master reset signal, for generating a first reset signal, a second reset signal, a third reset signal, and a fourth reset signal that are deactivated with differing delays from the master reset signal;

a first divider, clocked by the first clock, and activated by the first reset signal, generating a first divided clock, the first divider having an odd positive divisor;

a second divider, clocked by the second clock, and activated by the second reset signal, generating a second divided clock, the second divider having the odd positive divisor;

a third divider, clocked by the third clock, and activated by the third reset signal, generating a third divided clock, the third divider having the odd positive divisor;

a fourth divider, clocked by the fourth clock, and activated by the fourth reset signal, generating a fourth divided clock, the fourth divider having the odd positive divisor;

a frequency doubler, receiving the first, second, third, and fourth divided clocks, for generating an output clock by logically combining the first, second, third, and fourth divided clocks, the output clock having a frequency that is double a frequency of the first divided clock.

19. The 1.5 divider of claim 18 wherein the odd positive divisor is 3, wherein the output clock has a frequency that is a factor of 1.5 less than an input frequency of the first clock.

20. The 1.5 divider of claim 18 wherein the frequency doubler comprises:

a first NAND gate, receiving the first divided clock and the fourth divided clock;

a second NAND gate, receiving the second divided clock and the third divided clock;

a summing gate, coupled to the first and second NAND gates, for generating the output clock.

* * * * *